(12) United States Patent
Wang

(10) Patent No.: US 9,529,015 B2
(45) Date of Patent: Dec. 27, 2016

(54) DUAL POWER-SOURCE COMMUNICATION TESTING APPARATUS AND COMMUNICATION TESTING METHOD THEREOF

(71) Applicants: Inventec Appliances (Pudong) Corporation, Shanghai (CN); INVENTEC APPLIANCES CORP., New Taipei (TW); INVENTEC APPLIANCES (SHANGHAI) CO.,LTD., Shanghai (CN)

(72) Inventor: Will Wang, Shanghai (CN)

(73) Assignees: INVENTEC APPLIANCES (PUDONG) CORPORATION, Shanghai (CN); INVENTEC APPLIANCES CORP., New Taipei (TW); INVENTEC APPLIANCES (SHANGHAI) CO., LTD., Shanghai (CN)

( * ) Notice: Subject to any disclaimer, the term of this patent is extended or adjusted under 35 U.S.C. 154(b) by 212 days.

(21) Appl. No.: 13/786,719

(22) Filed: Mar. 6, 2013

(65) Prior Publication Data

US 2013/0234751 A1 Sep. 12, 2013

(30) Foreign Application Priority Data

Mar. 6, 2012 (CN) .......................... 2012 1 0056091

(51) Int. Cl.
*G01R 1/30* (2006.01)
*G06F 1/26* (2006.01)

(52) U.S. Cl.
CPC ................ *G01R 1/30* (2013.01); *G06F 1/266* (2013.01)

(58) Field of Classification Search
CPC ............ G01R 31/2839; G01R 31/2805; G01R 1/07328; G01R 31/043
See application file for complete search history.

(56) References Cited

U.S. PATENT DOCUMENTS

| | | | |
|---|---|---|---|
| 2006/0267599 A1* | 11/2006 | Pooranakaran et al. | 324/681 |
| 2011/0039605 A1* | 2/2011 | Choi | H02J 7/0047 455/573 |
| 2011/0128020 A1* | 6/2011 | Amanuma | 324/750.01 |
| 2013/0013938 A1* | 1/2013 | Abdelsamie et al. | 713/310 |

* cited by examiner

*Primary Examiner* — Tung X Nguyen
*Assistant Examiner* — Feba Pothen
(74) *Attorney, Agent, or Firm* — Muncy, Geissler, Olds & Lowe, P.C.

(57) ABSTRACT

A dual power-source testing apparatus for testing a communication board and communication testing method thereof are disclosed. The communication testing apparatus comprises a main body, a first power supply module, and a second power supply module. The main body has a communication testing area with a first port and a second port for supplying power, wherein the board is to be placed in the communication testing area. The first power supply module is configured to provide first power to the communication board through the communication testing area while performing a charging operation to the second power supply module. The communication testing method is to be performed similarly in a communication testing apparatus using dual power sources. Using the present invention may keep good qualities of communication testing operations being performed to the communication board.

7 Claims, 3 Drawing Sheets

DUAL POWER-SOURCE COMMUNICATION TESTING APPARATUS AND COMMUNICATION TESTING METHOD THEREOF

CROSS-REFERENCE TO RELATED APPLICATION

This application claims the benefit of China Patent Application No. 201210056091.1, filed on Mar. 6, 2012, in the State Intellectual Property Office of the People's Republic of China, the disclosure of which is incorporated herein in its entirety by reference.

BACKGROUND OF THE INVENTION

1. Field of the Invention

The present invention relates to a communication testing apparatus and communication testing method thereof, and more particularly relates to a dual power-source communication testing apparatus and communication testing method thereof.

2. Description of the Related Art

A variety of network communication products gradually appear in market along with the progress in network communication industry. Before these network communication products are ready for sale, the inner board to be used for communication must undergo related communication testing operations, performed by a communication testing apparatus in a production line, such as calibration, or integration, such that the quality of these network communication products can be kept up. For example, the calibration operation, such as power calibration of radio frequency (RF), often is affected by unstable power supply of communication testing apparatus during communication testing operation for calibration.

Therefore, developing a technique capable of improving communication testing operations performed on a communication board should be beneficial to producing higher quality products in network communication industry.

SUMMARY OF THE INVENTION

In view of such problems as mentioned above, an objective of the present invention is to provide a dual power-source communication testing apparatus and communication testing method thereof.

Therefore, the present invention provides a dual power-source communication testing apparatus for testing a board to be used for communication, and the communication testing apparatus includes a main body, a first power supply module, and a second power supply module. The main body has a communication testing area with a first port and a second port, for supplying power, wherein the board, is to be placed in the communication testing area. The first power supply module is connected electrically to the first port. The second power supply module is connected electrically to the second port. And the first power supply module is configured to provide first power to the communication board through the communication testing area, while the first power supply module performs a charging operation to the second power supply module.

In an embodiment of the dual power-source communication testing apparatus, the communication board comprises a circuit board. Also specifically, the second power supply module may comprise a capacitor, and the step of performing a charging operation to the second power supply module may comprise performing a charging operation to the capacitor for the capacitor to provide second power to the board, instead of the first power provided by the first power supply module. In an embodiment, the main body has a covering to cover the communication testing area.

In an embodiment, the first power supply module includes a USB connector electrically connected to the first port, and the second power supply module includes a pogo pin electrically connected to the second port.

The present invention also provides a communication testing method using dual power sources, wherein the method includes: in a communication testing apparatus, placing a board to be used for communication in a communication testing area having a first port and a second port for supplying power; connecting a first power supply module to the first port for providing first power to the communication board; connecting a second power supply module to the second port for providing second power to the communication board; and performing a communication testing operation to the communication board.

In an embodiment, the communication testing method farther comprises the first power supply module providing the first power to the communication board while performing a charging operation to the second power supply module. Moreover and specifically, the step of performing a charging operation to the second power supply module may comprise performing a charging operation to a capacitor of the second power supply module for the capacitor to provide the second power to the communication board, instead of the first power provided by the first power supply module.

Advantages of the present invention may include that the first power supply module provides the first power to the communication board while a charging operation is performed to the second power supply module, and the second power supply module can provide the second power to the communication board, instead of the first power provided by the first power supply module, so as to keep good qualities of communication testing operations being performed to the communication board.

BRIEF DESCRIPTION OF THE DRAWINGS

The detailed structure, operating principle and effects of the present invention will now be described in more details hereinafter with reference to the accompanying drawings that show various embodiments of the invention as follows.

DETAILED DESCRIPTION OF THE PREFERRED EMBODIMENTS

The technical content of the present invention will become apparent by the detailed description of the following embodiments and the illustration of related drawings as follows.

Figure 1:
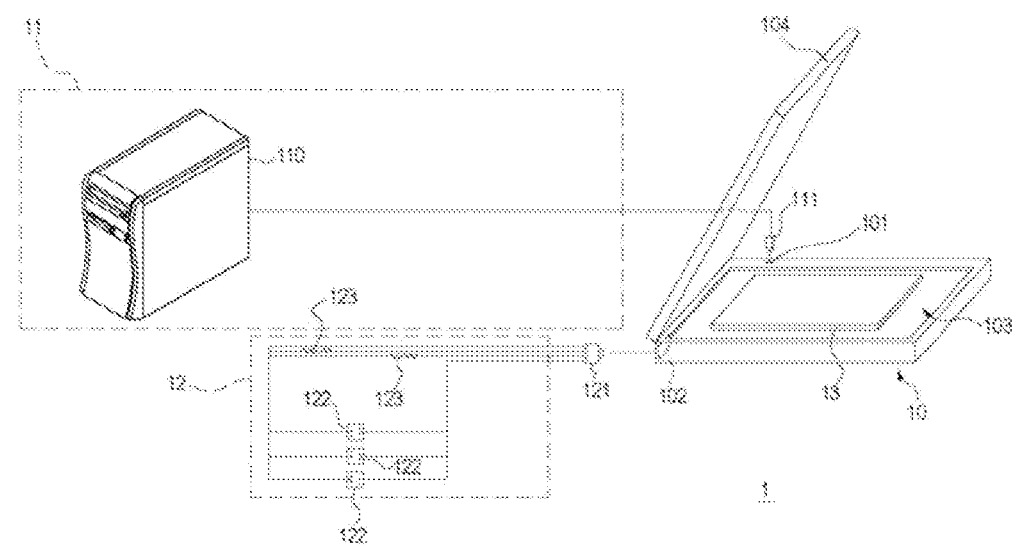
FIG. 1 schematically illustrates a dual power-source communication testing apparatus according to an embodiment of the present invention.

FIG. 1 schematically illustrates a dual power-source communication testing apparatus according to an embodiment of the present invention.

As shown in FIG. 1, the dual power-source communication testing apparatus 1 comprises a main body 10, a first power supply module 11 and a second power supply module 12.

The main body 10 has a communication testing area 103 with a first port 101 and a second port 102 for supplying power, and the first power supply module 11 is connected electrically to the first port 101, and the second power supply module 12 is connected electrically to the second port 102.

Specifically, the first power supply module 11 may comprise a computing unit 110 and a USB connector 111 connected electrically to computing unit 110. The first power supply module 11 is connected electrically to the first port 101 through the USB connector 111. The second power supply module 12 is connected electrically to the second port 101 through the Pogo pin connector 121.

In the dual power-source communication testing apparatus 1, a board 13 to be used for communication is placed in the communication testing area 103 for performing testing operations. The communication board 13 may comprise a circuit board such as a communication main board to be used for communication. And the first power supply module 11 is configured to provide first power to the communication board 13 through the communication testing area 103 while performing a charging operation to the second power supply module 12.

For example, the second power supply module 12 may be a simulated battery comprising at least one capacitor 122. The first power supply module 11 provides first power to the communication board 13 through the communication testing area 103 while performing a charging operation to the capacitor 122, and the capacitor 122 provides second power and a direct current (DC) of the second power supply module 12 to the communication board 13, instead of the first power provided by the first power supply module 11, for example, in the case that the first power supply module 11 supplies power unstably due to bad electric power quality or outside interference.

Therefore, at the instant of failure to provide the first power by the first power supply module 11, the second power supply module 12 can provide the second power to the communication board 13 instead, so as to ensure the quality of communication testing operations performed to the communication board 13 is not affected or interfered by the instability of the first power.

The main body 10 may comprise a covering 104. Therefore, when the communication board 13 is placed in communication testing area 103, the communication testing area 103 can be covered by covering 104 to protect the communication board 13. The second power supply module 12 also can comprise one or more resistor 123; the pogo pin 121 can comprise grounding circuit, temperature detecting circuit or voltage circuit, to match the demand for circuit design of second power supply module 12. Preferably, the capacitor 122 may be 330 uF or 1600 uF; resistor 123 may be 34.8K ohm or 75K ohm to match circuit design. However, reality demand may be different, so capacitance of capacitor 122 and resistance of resistor 123 are not limited thereto.

Figure 2:
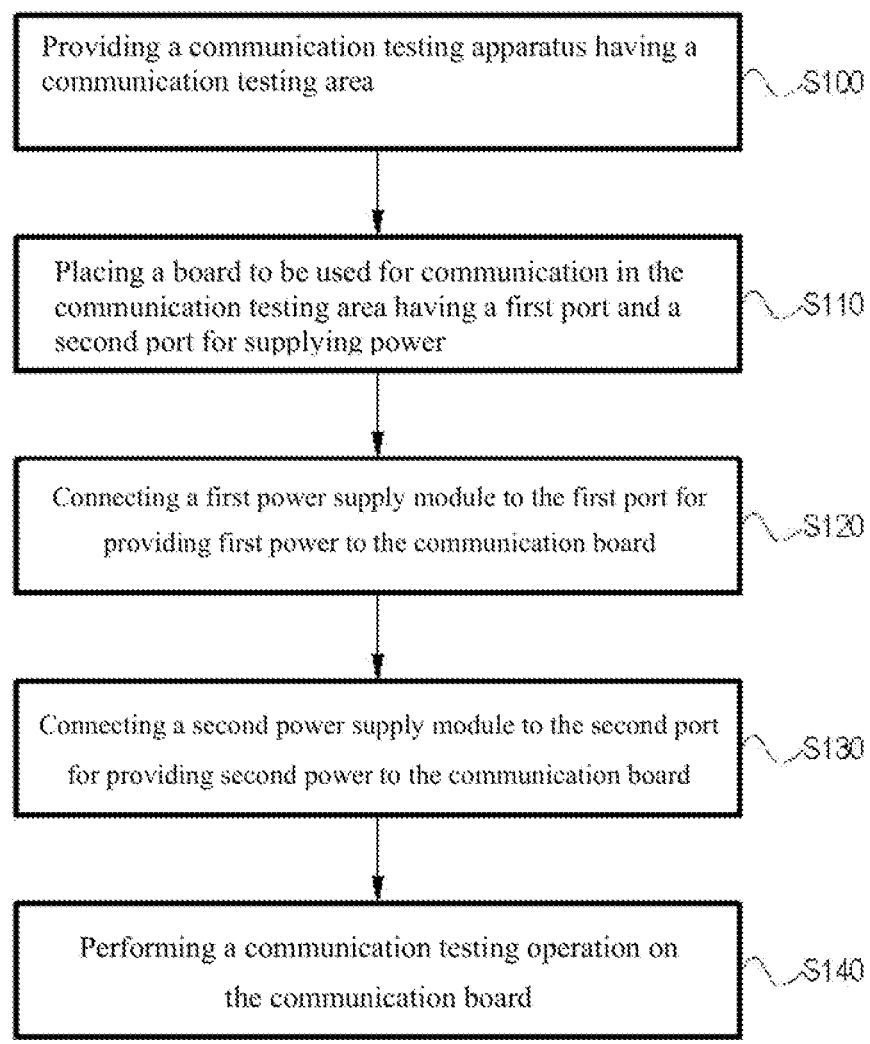
FIG. 2 is a flowchart illustrating a flow of a communication, testing method using dual power sources according to an embodiment of the present invention.

Referring to FIG. 1 and FIG. 2, FIG. 2 is a flow chart of the communication testing method using dual power sources according to an embodiment of the present invention.

The communication testing method using dual power sources provided by the present invention may include the following steps:

A communication testing apparatus having a communication testing area is provided (at step S100); step S110 is placing a board to be used for communication in the communication testing area having a first port and a second port for supplying power; step S120 is connecting a first power supply module to the first port for providing first power to the communication board; step S130 is connecting a second power supply module to the second port for providing second power to the communication board; and step S140 is performing a communication testing operation to the communication board.

In order to keep good qualities of communication testing operations being performed to the communication board, such as power calibration of radio frequency, a communication testing apparatus (e.g. the dual power-source communication testing apparatus 1 shown in FIG. 1) having a communication testing area 103 with a first port 101 and a second port 102 for supplying power is provided (at step S100).

Next, an operator can place the communication board 13 in the communication testing area 103 (step S110). In various embodiments, the communication board may include a circuit board, such as a communication main board to be used for communication.

Then the next steps of S120, S130, and S140 may be performed.

In this method, the first power supply module 11 may provide the first power to the communication board 13 through the communication testing area 103 while performing a charging operation to the second power supply module 12. For example, the second power supply module 12 may be a simulated battery having one or more capacitors 122. When the first power supply module 11 provides the first power to the communication board 13 through the communication testing area 103, the first power supply module 11 also performs the charging operation to capacitor 122, and the capacitor 122 will provide the second power to the communication board 13 instead of the first power provided by the first power supply module 11, for example, in the case that the first power supply module 11 supplies power unstably due to bad electric power quality or outside interference.

Therefore, the second power supply module 12 can supply the second power to the communication board 13 instead of the first power provided by the first power supply module 11 upon the instant of failure to provide the first power by the first power supply module 11, so as to ensure the quality of communication testing operations (such as radio frequency (RF) power calibration) performed to the communication board 13 is not affected or interfered by instability of the first power while the communication testing operations are performed.

For brevity, characteristics of structure or operation principle operation principle relative to the communication testing apparatus (dual power-source communication testing apparatus 1) can refer to FIG. 1 and explanation thereof, and description in detail is omitted herein.

Figure 3:
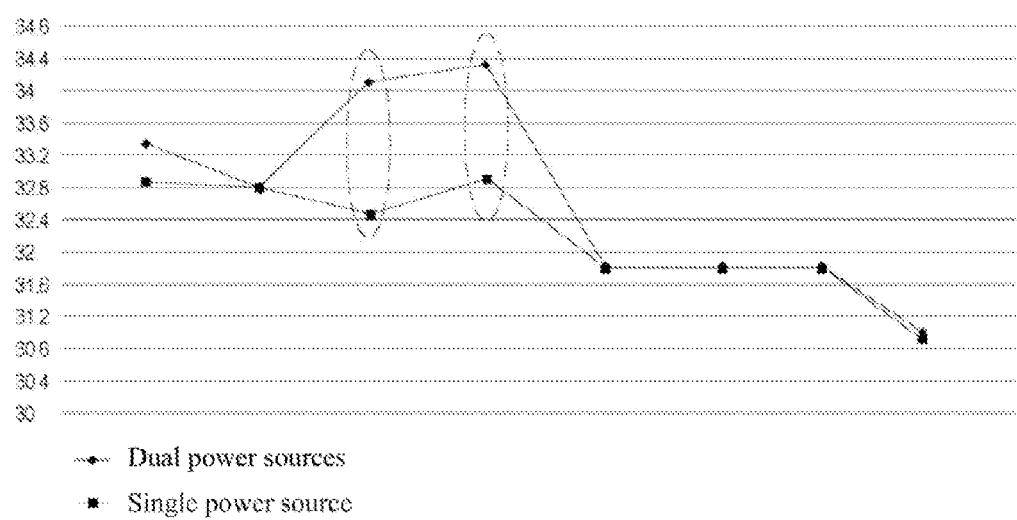
FIG. 3 schematically illustrates the result of communication testing operation performed by the dual power-source communication testing apparatus and communication testing method thereof according to an embodiment of the present invention.

FIG. 3 is a schematic view showing the result of communication testing operation performed by the dual power-source communication testing apparatus and communication testing method thereof according to an embodiment of the present invention.

As shown in FIG. 3, in the result of communication testing operation performed by the dual power-source communication testing apparatus and communication testing method thereof provided by the present invention, the average power of RF calibration (34.1.2 and 34.31) in the case of using dual power sources, such as the first power and the second power, is obvious higher than that of using single power (32.48 and 32.99), therefore good qualities of communication testing operations being performed to the communication board can be kept.

According to the above description, the dual power-source communication testing apparatus and communication testing method thereof provided by the present invention may have the following characteristics:

1. The second power supply module am supply power to the communication board instead of the first power provided by the first power supply module while the first power supply module cannot provide the first power, such that the quality of communication testing operation being performed to the communication board can be kept up.

2. By using the second power supply module to supply power to communication board instead, the process yield rate of the communication board also can be greatly improved.

While embodiments of the present invention have been described in connection with certain exemplary embodiments, it is to be understood that the invention is not limited to the disclosed embodiments, but, on the contrary, is intended to cover various modifications and equivalent arrangements included within the spirit and scope of the appended claims.

What is claimed is:

1. A dual power-source communication testing apparatus for testing a board to be used for communication, the communication testing apparatus comprising:
   a main body, having a communication testing area with a first port and a second port for supplying power, wherein the communication board is to be placed in the communication testing area;
   a first power supply module, electrically and detachably connected to the first port; and
   a second power supply module, electrically and detachably connected to the second port through a pogo pin connector, the pogo pin connector comprising a grounding circuit, a temperature detecting circuit or a voltage circuit;
   wherein the first power supply module, the second power supply module, and the main body are physical independently arranged, and the first power supply module and the second power supply module are separated devices;
   wherein the first power supply module is configured to provide first power directly to the communication board through the communication testing area while performing a charging operation to the second power supply module via the main body;
   wherein when the first power supply module does not stably provide the first power, the second power supply module provides a second power to the communication board, instead of the first power provided by the first power supply module.

2. The communication testing apparatus of claim 1, wherein the communication board comprises a circuit board.

3. The communication testing apparatus of claim 1, wherein the second power supply module comprises a capacitor, and said performing a charging operation to the second power supply module comprises performing a charging operation to the capacitor for the capacitor to provide second power to the communication board, instead of the first power provided by the first power supply module, when the first power supply does not stably provide the first power.

4. The communication testing apparatus of claim 1, wherein the first power supply module includes a USB connector electrically connected to the first port.

5. The communication testing apparatus of claim 1, wherein the main body has a covering to cover the communication testing area.

6. A communication testing method using dual power sources, comprising:
   in a communication testing apparatus, placing a board to be used for communication in a communication testing area having a first port and a second port for supplying power;
   connecting a first power supply module to the first port for providing first power to the communication board, the first power supply module being electrically and detachably connected to the first port;
   connecting a second power supply module to the second port through a pogo pin connector for providing second power to the communication board, the second power supply module being electrically and detachably connected to the second port and the pogo pin connector comprising a grounding circuit, a temperature detecting circuit or a voltage circuit;
   performing a communication testing operation to the communication board; and
   the first power supply module providing the first power directly to the communication board while performing a charging operation to the second power supply module via a main body of the communication testing apparatus;
   wherein the first power supply module, the second power supply module, and the main body are physical independently arranged, and the first power supply module and the second power supply module are separated devices;
   wherein when the first power supply module does not stably provide the first power, the second power supply module provides the second power to the communication board, instead of the first power provided by the first power supply module.

7. The communication testing method of claim 6, wherein said performing a charging operation to the second power supply module comprises performing a charging operation to a capacitor of the second power supply module for the capacitor to provide the second power to the communication board, instead of the first power provided by the first power supply module, when the first power supply does not stably provide the first power.

* * * * *